(12) United States Patent
Peng et al.

(10) Patent No.: US 11,935,344 B2
(45) Date of Patent: Mar. 19, 2024

(54) AUTOMOBILE KEY PROGRAMMER AND AUTOMOBILE DIAGNOSTIC INSTRUMENT

(71) Applicant: AUTEL INTELLIGENT TECHNOLOGY CORP., LTD., Guangdong (CN)

(72) Inventors: Wengang Peng, Guangdong (CN); Yong Chen, Guangdong (CN)

(73) Assignee: AUTEL INTELLIGENT TECHNOLOGY CORP., LTD., Guangdong (CN)

( * ) Notice: Subject to any disclaimer, the term of this patent is extended or adjusted under 35 U.S.C. 154(b) by 231 days.

(21) Appl. No.: 17/659,888

(22) Filed: Apr. 20, 2022

(65) Prior Publication Data
US 2022/0245980 A1 Aug. 4, 2022

Related U.S. Application Data

(63) Continuation of application No. PCT/CN2020/120861, filed on Oct. 14, 2020.

(30) Foreign Application Priority Data
Oct. 30, 2019 (CN) .......................... 201911045977.4

(51) Int. Cl.
*G07C 9/00* (2020.01)
*H04L 27/04* (2006.01)
*H04L 27/12* (2006.01)

(52) U.S. Cl.
CPC ..... *G07C 9/00857* (2013.01); *G07C 9/00309* (2013.01); *H04L 27/04* (2013.01);
(Continued)

(58) Field of Classification Search
CPC ............ G07C 9/00857; G07C 9/00309; G07C 2009/00785; G07C 2009/00984;
(Continued)

(56) References Cited

U.S. PATENT DOCUMENTS

| 5,739,766 A | 4/1998 | Chaloux |
| 9,317,984 B2 | 4/2016 | Cregg et al. |

(Continued)

FOREIGN PATENT DOCUMENTS

| CN | 101303572 A | 11/2008 |
| CN | 101625773 A | 1/2010 |

(Continued)

OTHER PUBLICATIONS

International search report of PCT/CN2020/120861 dated Jan. 14, 2021.

(Continued)

*Primary Examiner* — Nam V Nguyen (57) ABSTRACT

This disclosure relates to the technical field of automobiles and discloses an automobile key programmer applied to an automobile diagnostic instrument, wherein the automobile key programmer includes an activation coil, a first changeover switch, a second changeover switch, an infrared modulation circuit, an amplitude shift keying modulation circuit, and a frequency shift keying modulation circuit; when the first changeover switch is not powered on, the infrared modulation circuit provides a resonant voltage for the activation coil; when the first changeover switch is powered on and the second changeover switch is not powered on, the amplitude shift keying modulation circuit provides a resonant voltage for the activation coil; when both the first changeover switch and the second changeover switch are powered on, the frequency shift keying modulation circuit provides a resonant voltage for the activation coil; only one coil is required in the automobile key programmer to change voltages.

20 Claims, 4 Drawing Sheets

(52) U.S. Cl.
CPC .. *H04L 27/125* (2013.01); *G07C 2009/00785* (2013.01); *G07C 2009/00984* (2013.01)

(58) Field of Classification Search
CPC ...... G07C 2009/00769; G07C 2205/02; G07C 9/00; H04L 27/04; H04L 27/125; H04L 27/12; H03K 17/005; H03K 17/6257; H03K 17/51
USPC ................................................ 340/5.61, 5.64
See application file for complete search history.

(56) References Cited

U.S. PATENT DOCUMENTS

| | | | |
|---|---|---|---|
| 10,922,500 B2 * | 2/2021 | Horchak | G06K 7/10138 |
| 2008/0280602 A1 | 11/2008 | Ban | |
| 2009/0231094 A1 | 9/2009 | Higgins et al. | |
| 2016/0098871 A1 * | 4/2016 | Oz | G01S 19/42 340/5.61 |
| 2016/0127116 A1 | 5/2016 | Meier et al. | |

FOREIGN PATENT DOCUMENTS

| | | |
|---|---|---|
| CN | 206436975 U | 8/2017 |
| CN | 110661516 A | 1/2020 |
| CN | 211378000 U | 8/2020 |
| EP | 1990752 B1 | 4/2012 |
| JP | 4720781 B2 | 7/2011 |

OTHER PUBLICATIONS

The ARRL Handbook published on Jan. 1, 2011; Published by ARRL; 6 pages.

Extended European Search Report dated Nov. 18, 2022; Appln. No. 20882892.1.

* cited by examiner

FIG. 5

AUTOMOBILE KEY PROGRAMMER AND AUTOMOBILE DIAGNOSTIC INSTRUMENT

CROSS REFERENCE

This application is a continuation of International Patent Application No. PCT/CN2020/120861 filed on Oct. 14, 2020, which claims priority to Chinese Patent Application No. 201911045977.4, entitled "Automobile Key Programmer and Automobile Diagnostic Instrument", filed with the China Patent Office of CNIPA on Oct. 30, 2019, both of which are incorporated herein by reference in its entireties.

BACKGROUND

Technical Field

The present application relates to the technical field of automobiles, more particularly, to an automobile key programmer and an automobile diagnostic instrument.

Related Art

With the rapid advance of automobile diagnostic technology, automobile key programmer has become a very important and convenient tool for automobile maintenance. A user can use an automobile key programmer in combination with a diagnostic host computer to enable a quick implementation of the information read-write programming for an automobile key.

In the implementation of the embodiments of the present invention, the inventors have identified a problem in the prior art, that is, various types of vehicles have their corresponding automobile keys that diversifies in design and frequency, in a conventional automobile key programmer, the coils for activating a key are generally two or more, and a key is programmed by applying different resonant voltages to different coils to activate the key, and the different resonant voltages usually require a plurality of different coils be configured, which results in a bulky size and increased production costs of the product.

SUMMARY

It is an object of the embodiments of the present invention to address the above-discussed problem in the prior art by providing an automobile key programmer and an automobile diagnostic instrument that can activate different types of keys.

The object of the embodiments of the present invention is realized through the following technical solution.

To solve the above technical problem, in a first aspect, the present invention provides an automobile key programmer, including:

an activation coil;

a first changeover switch including a first connection terminal, a second connection terminal, and a third connection terminal, wherein the first connection terminal is connected to the activation coil, and the first connection terminal can communicate with the second connection terminal or the third connection terminal;

an infrared modulation circuit connected to the second connection terminal;

a second changeover switch including a fourth connection terminal, a fifth connection terminal, and a sixth connection terminal, wherein the fourth connection terminal is connected to the third connection terminal, and the fourth connection terminal can communicate with the fifth connection terminal or the sixth connection terminal;

an amplitude shift keying modulation circuit connected to the fifth connection terminal; and a frequency shift keying modulation circuit connected to the sixth connection terminal.

In some embodiments, the first changeover switch and the second changeover switch are both relays.

In some embodiments, the automobile key programmer further includes:

a main control chip connected to input terminals of the infrared modulation circuit, the amplitude shift keying modulation circuit and the frequency shift keying modulation circuit, respectively;

a first switch having a control terminal connected to the main control chip, wherein a coil input terminal of the first changeover switch is configured to connect a power supply, a coil output terminal of the first changeover switch is connected to an input terminal of the first switch, and an output terminal of the first switch is grounded;

a second switch having a control terminal connected to the main control chip, wherein a coil input terminal of the changeover second switch is configured to connect a power supply, a coil output terminal of the second changeover switch is connected to an input terminal of the second switch, and an output terminal of the second switch is grounded; wherein the main control chip is configured to output a high level, respectively, to control the first switch and the second switch to turn on.

In some embodiments, the first switch and the second switch are both NPN triodes.

In some embodiments, a voltage selection circuit is connected between the sixth connection terminal and an output terminal of the frequency shift keying modulation circuit.

In some embodiments, the voltage selection circuit includes:

a third changeover switch including a seventh connection terminal, an eighth connection terminal, and a ninth connection terminal, wherein the seventh connection terminal is connected to the sixth connection terminal, and the seventh connection terminal can be connected to the eighth connection terminal or the ninth connection terminal;

a high-voltage transformation circuit connected between the eighth connection terminal and the output terminal of the frequency shift keying modulation circuit; and a low-voltage transformation circuit connected between the ninth connection terminal and the output terminal of the frequency shift keying modulation circuit.

In some embodiments, the third changeover switch is a relay.

In some embodiments, the voltage selection circuit further includes:

a third switch having a control terminal connected to the main control chip, wherein a coil input terminal of the third changeover switch is configured to connect a power supply, a coil output terminal of the third changeover switch is connected to an input terminal of the third switch, and an output terminal of the third switch is grounded.

In some embodiments, the third switch is an NPN triode.

In some embodiments, the infrared modulation circuit includes:
a first encryption chip having an input terminal connected to the main control chip and an output terminal connected to the second connection terminal; and
a first resonant circuit connected in parallel between two control ports of the first encryption chip.

In some embodiments, the first resonant circuit includes:
a first crystal oscillator connected in parallel between two the control ports of the first encryption chip;
a first capacitor having a terminal connected to a terminal of the first crystal oscillator and another terminal grounded; and
a second capacitor having a terminal connected to another terminal of the first crystal oscillator and another terminal grounded;

In some embodiments, the amplitude shift keying modulation circuit includes:
a second encryption chip having an input terminal connected to the main control chip and an output terminal connected to the fifth connection terminal; and
a second resonant circuit connected in parallel between two control ports of the second encryption chip.

In some embodiments, the second resonant circuit includes:
a second crystal oscillator connected in parallel between the two control ports of the second encryption chip;
a third capacitor having a terminal connected to a terminal of the second crystal oscillator and another terminal grounded; and
a fourth capacitor having a terminal connected to another terminal of the second crystal oscillator and another terminal grounded.

In some embodiments, the frequency shift keying modulation circuit includes:
a third encryption chip having an input terminal connected to the main control chip and an output terminal connected to the high-voltage transformation circuit and the low-voltage transformation circuit; and
a third resonant circuit connected in parallel between two control ports of the third encryption chip.

In some embodiments, the third resonant circuit includes:
a third crystal oscillator connected in parallel between two the control ports of the third encryption chip;
a fifth capacitor having a terminal connected to a terminal of the third crystal oscillator and another terminal grounded; and
a sixth capacitor having a terminal connected to another terminal of the third crystal oscillator and another terminal grounded.

In some embodiments, the automobile key programmer further includes:
a first rectification filter circuit having an input terminal connected to the coil input terminal of the first changeover switch and an output terminal connected to the input terminal of the first switch and the coil output terminal of the first changeover switch; and
a second rectification filter circuit having an input terminal connected to the coil input terminal of the second changeover switch and an output terminal connected to the input terminal of the second changeover switch and the coil output terminal of the second switch.

In some embodiments, the first rectification filter circuit includes:
a seventh capacitor having a terminal connected to the coil input terminal of the first changeover switch and another terminal grounded;
an eighth capacitor connected in parallel to two terminals of the seventh capacitor; and
a first diode having an input terminal connected to the coil output terminal of the first changeover switch and an output terminal connected to the coil input terminal of the first changeover switch.

In some embodiments, the second rectification filter circuit includes:
a ninth capacitor having a terminal connected to the coil input terminal of the second changeover switch and another terminal grounded;
a tenth capacitor connected in parallel to two terminals of the ninth capacitor; and
a second diode having an input terminal connected to the coil output terminal of the second changeover switch and an output terminal connected to the coil input terminal of the second changeover switch.

In some embodiments, the automobile key programmer further includes:
a third rectification filter circuit having an input terminal connected to the coil input terminal of the third switch and an output terminal connected to the input terminal of the third switch and the coil output terminal of the third changeover switch.

In some embodiments, the third rectification filter circuit includes:
an eleventh capacitor having a terminal connected to the coil input terminal of the third changeover switch and another terminal grounded;
a twelfth capacitor connected in parallel to two terminals of the eleventh capacitor; and
a third diode having an input terminal connected to the coil output terminal of the third changeover switch and an output terminal connected to the coil input terminal of the third changeover switch.

To solve the above technical problem, in a second aspect, the embodiments of the present invention provide an automobile diagnostic instrument including: a host computer communicatively connected to the automobile key programmer, for example, as described above in the first aspect.

The present invention is more advantageous than the prior art in that, unlike the prior art, the embodiments of the present invention provide an automobile key programmer applied to an automobile diagnostic instrument, wherein the automobile key programmer includes an activation coil, a first changeover switch, a second changeover switch, an infrared modulation circuit, an amplitude shift keying modulation circuit, and a frequency shift keying modulation circuit; when the first changeover switch is not powered on, the infrared modulation circuit provides a resonant voltage for the activation coil; when the first changeover switch is powered on and the second changeover switch is not powered on, the amplitude shift keying modulation circuit provides a resonant voltage for the activation coil; when both the first changeover switch and the second changeover switch are powered on, the frequency shift keying modulation circuit provides a resonant voltage for the activation coil; only one coil is required in the automobile key programmer provided in the embodiments of the present invention to change from one to another in the three resonant voltages, so as to satisfy the needs of different types of keys for the coils.

BRIEF DESCRIPTION OF THE DRAWINGS

One or more embodiments are illustrated by way of example and not by way of limitation in conjunction with corresponding figures in the accompanying drawings, in which like reference numerals indicate like elements/modules and steps, and the figures are not drawn to scale unless stated otherwise.

DETAILED DESCRIPTION

Hereinafter, the present invention will be described in detail with reference to specific embodiments. The following embodiments will help those skilled in the art to further understand the present invention, but do not limit the present invention in any form. It should be noted that those skilled in the art can make several modifications and improvements without departing from the concept of the present invention and these modifications and improvements shall all fall within the scope of the present invention.

In order that the object, aspects and advantages of the present application may be more clearly understood, a detailed description of the invention is provided with reference to the accompanying drawings and embodiments. It should be understood that the particular embodiments described herein are illustrative only and are not intended to limit the present invention.

It should be noted that various features of the embodiments of the present invention can be combined if there can be no conflicts and these combinations are included within the scope of the present application. In addition, although a division of the functional modules is made in the schematic diagram, in some cases, such a division may be different from a division in an actual apparatus. Further, terms like "first", "second", "third", and the like, are not intended to define the importance or sequence, but merely to distinguish between identical or similar items that have substantially the same function and effect.

Furthermore, when an element is referred to as being "secured" to another element, the element can be on the other element directly or through one or more intermediate elements. When an element is referred to as being "connected" to another element, the element can be connected to the other element directly or through one or more intermediate elements. The terms like "vertical", "horizontal", "left", "right", and so on are used herein for descriptive purposes only.

Unless defined otherwise, all technical and scientific terms used in the description have the same meaning as commonly understood by one of ordinary skill in the art to which this invention pertains. The terminology used in the description of the invention herein is for the purpose of describing particular embodiments only and is not intended to limit the invention. As used in this description, the term "and/or" includes any and all combinations of one or more of the associated listed items, and the features referred to in the various embodiments of the invention described below may be combined if there can be no conflicts.

The embodiments of the present invention provide an automobile key programmer and an automobile diagnostic instrument, wherein the automobile key programmer controls one of an infrared modulation circuit, an amplitude shift keying modulation circuit, and a frequency-shift-keying modulation circuit to communicate with an activation coil by controlling an on or off state of connection terminals of two changeover switches, so as to satisfy the requirements of different types of keys for coils adapted to different resonant voltages. With the automobile key programmer provided by the embodiments of the present invention, not only the function of activating various types of keys by a single coil can be enabled, but also the product can be more compact with a beautiful appearance, and the production costs are reduced.

In particular, embodiments of the present invention will be further described below with reference to the drawings.

Figure 1:
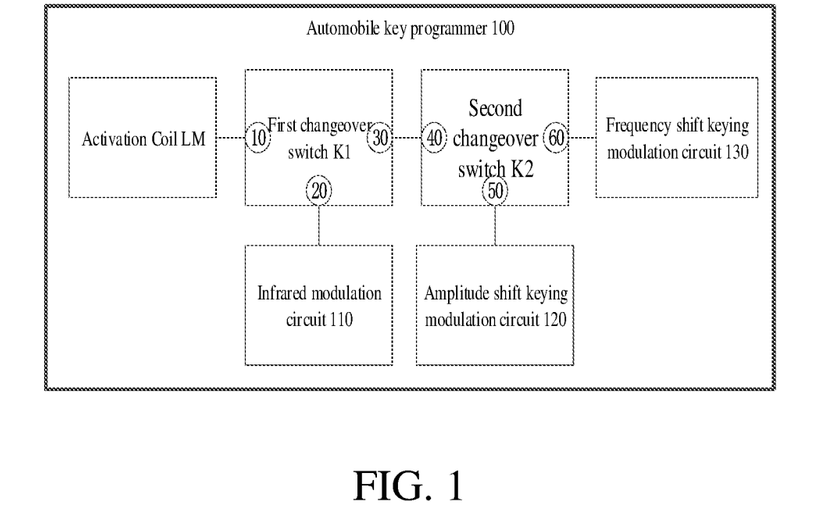
FIG. 1 is a schematic view showing a structure of an automobile key programmer according to an embodiment of the present invention.

An embodiment of the present invention provides an automobile key programmer. Referring to FIG. 1, a structure of an automobile key programmer according to an embodiment of the present invention is shown. The automobile key programmer 100 includes: an activation coil LM, a first changeover switch K1, an infrared modulation circuit 110, a second changeover switch K2, an amplitude shift keying modulation circuit 120, and a frequency shift keying modulation circuit 130. Herein, the first changeover switch K1 includes a first connection terminal 10, a second connection terminal 20 and a third connection terminal 30, the first connection terminal 10 is connected to the activation coil LM, the first connection terminal 10 can communicate with the second connection terminal 20 or the third connection terminal 30.

The second changeover switch K2 includes a fourth connection terminal 40, a fifth connection terminal 50, and a sixth connection terminal 60, wherein the fourth connection terminal 40 is connected to the third connection terminal 30, and the fourth connection terminal 40 can communicate with the fifth connection terminal 50 or the sixth connection terminal 60.

In particular, the first changeover switch K1 and the second changeover switch K2 are mechanical or electronic switches that can be switched to multiple circuits, for example, relays, selector switches, toggle switches, and the like, generally provided with one movable contact/contact piece and multiple fixed contacts/contact pieces, and switching from one circuit to another is realized by controlling to connect and disconnect the movable contact/contact piece and the fixed contact/contact piece in turn.

The infrared modulation circuit 110 is connected to the second connection terminal 20. The amplitude shift keying modulation circuit 120 is connected to the fifth connection terminal 50. The frequency shift keying modulation circuit 130 is connected to the sixth connection 60.

In particular, the activation coil LM is configured to apply different resonant voltages to activate different types of automobile keys, and then program the keys, for example, by reading and writing data. The infrared modulation circuit 110, the amplitude shift keying modulation circuit 120, and the frequency shift keying modulation circuit 130 are configured to provide different resonant voltages so that different resonant voltages can be applied to the activation coil LM when the activation coil LM is in communication with the infrared modulation circuit 110, the amplitude shift keying modulation circuit 120, and the frequency shift keying modulation circuit 130, respectively.

Herein, the infrared modulation circuit 110 can provide an infrared modulated resonant signal and a resonant voltage, which can accordingly activate and read-write an infrared modulated automobile key, such as a Benz infrared key. The amplitude shift keying modulation circuit 120 can provide a resonant signal and a resonant voltage modulated with amplitude shift keying (a way to modulate a key signal, using an amplitude of a carrier wave to transfer information), and accordingly can be configured to activate and read-write an automobile key modulated by amplitude shift keying. The frequency shift keying modulation circuit 130 can provide a resonant signal and a resonant voltage modulated by frequency shift keying (a way to modulate a key signal, using a frequency change of a carrier wave to transmit information), and accordingly can be configured to activate and read-write an automobile key modulated by frequency shift keying.

An embodiment of the present invention provides an automobile key programmer 100 applied to an automobile diagnostic instrument, and the automobile key programmer 100 includes an activation coil LM, a first changeover switch K1, a second changeover switch K2, an infrared modulation circuit 110, an amplitude shift keying modulation circuit 120, and a frequency shift keying modulation circuit 130; herein, when the first changeover switch K1 is not powered on, the infrared modulation circuit 110 provides a resonant voltage for the activation coil LM; when the first changeover switch K1 is powered on and the second changeover switch K2 is not powered on, the amplitude shift keying modulation circuit 120 provides a resonant voltage for the activation coil LM; when both the first changeover switch K1 and the second changeover switch K2 are powered on, the frequency shift keying modulation circuit 130 provides a resonant voltage for the activation coil LM. In the automobile key programmer 100 provided in the embodiment of the present invention, only one coil is necessary to switch from one to another in the three resonant voltages, so as to satisfy the requirements of different types of keys for the coils.

Figure 2:
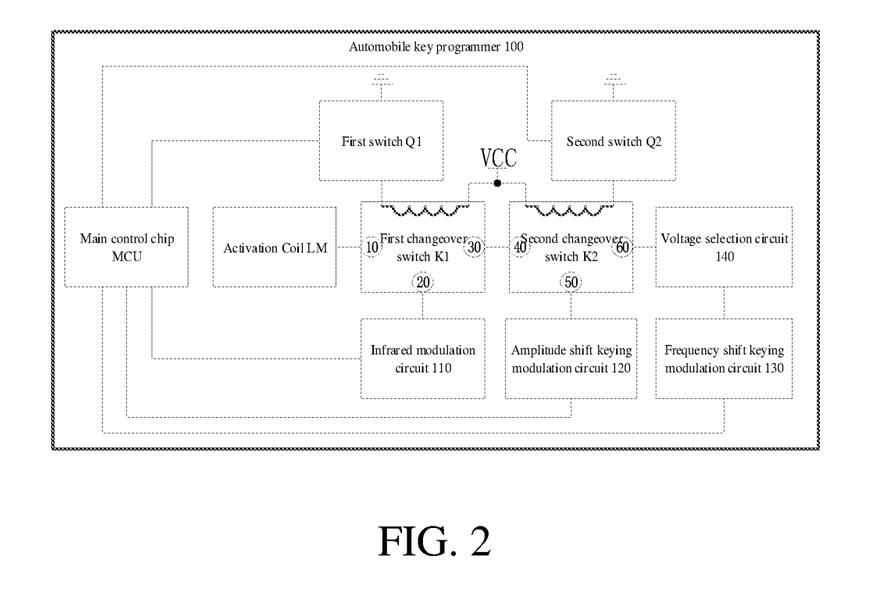
FIG. 2 is a schematic view showing a structure of another automobile key programmer according to an embodiment of the present invention.

In some embodiments, the first changeover switch K1 and the second changeover switch K2 are both relays. Referring also to FIG. 2, a structure of another automobile key programmer provided by an embodiment of the present invention is shown. The automobile key programmer 100 further includes: a main control chip MCU, a first switch Q1, a second switch Q2, and a voltage selection circuit 140.

The main control chip MCU is connected to input terminals of the infrared modulation circuit 110, the amplitude shift keying modulation circuit 120, and the frequency shift keying modulation circuit 130, respectively.

In the embodiment of the present invention, the main control chip MCU is a micro-processor capable of performing data interaction with a host computer in the automobile diagnostic instrument, and the micro-processor has a certain computing capability and can be configured to set various parameters, acquire various parameters, store various parameters, receive various information, process various information, and send various information and instructions; for example, the main control chip MCU can be a small single chip microcomputer.

In particular, the main control chip MCU can acquire data information about infrared modulation, amplitude shift keying modulation, or frequency shift keying modulation, send the data information to the infrared modulation circuit 110, the amplitude shift keying modulation circuit 120, and the frequency shift keying modulation circuit 130 after preliminary processing, acquire a control instruction on which one of the infrared modulation, the amplitude shift keying modulation, and the frequency shift keying modulation is correspondingly used, and control the on or off state of the first switch Q1 and the second switch Q2 according to the control instruction so as to enable one of the infrared modulation circuit 110, the amplitude shift keying modulation circuit 120, and the frequency shift keying modulation circuit 130 to communicate with the activation coil.

A control terminal of the first switch Q1 is connected to the main control chip MCU; a coil input terminal of the first changeover switch K1 is configured to connect a power supply; a coil output terminal of the first changeover switch K1 is connected to an input terminal of the first switch Q1; and an output terminal of the first switch Q1 is grounded.

A control terminal of the second switch Q2 is connected to the main control chip MCU; a coil input terminal of the second changeover switch K2 is configured to connect a power supply; a coil output terminal of the second changeover switch K2 is connected to an input terminal of the second switch Q2; and an output terminal of the second switch Q2 is grounded.

Herein, the first switch Q1 and the second switch Q2 are both NPN triodes. The main control chip MCU is configured to output a high level to the first switch Q1 and the second switch Q2, respectively, and control them to turn on, and the main control chip MCU is also configured to output a low level to the first switch Q1 and the second switch Q2, respectively, and control them to turn off. In the embodiment of the present invention, when the first switch Q1 is turned off, the first changeover switch K1 is not powered on, and the first connection terminal 10 is in communication with the second connection terminal 20; when the first switch Q1 turns on, the first changeover switch K1 is powered on, and the first connection terminal 10 is in communication with the third connection terminal 30; when the second switch Q2 turns off, the second changeover switch K2 is not powered on, and the fourth connection terminal 40 is in communication with the fifth connection terminal 50; when the second switch Q2 turns on, the second changeover switch K2 is powered on, and the fourth connection terminal 40 is in communication with the sixth connection terminal 60.

The voltage selection circuit 140 is connected between the sixth connection terminal 60 and an output terminal of the frequency shift keying modulation circuit 130. The voltage selection circuit 140 is configured to adjust a magnitude of a voltage of the resonant signal modulated by frequency shift keying, and in particular, the adjustment of the magnitude of the resonant voltage applied to both terminals of the activation coil LM can be achieved by adjusting the impedance of the voltage selection circuit 140 to adjust a magnitude of a voltage division of the voltage selection circuit 140.

Figure 3:
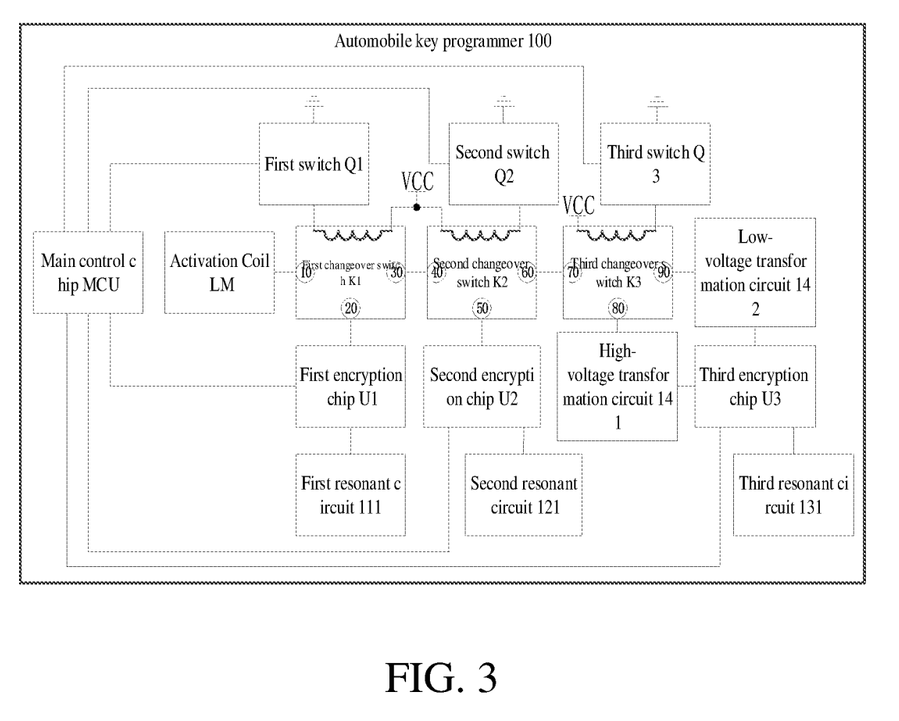
FIG. 3 is a schematic view showing a structure of another automobile key programmer according to an embodiment of the present invention.

In some embodiments, referring also to FIG. 3, a structure of another automobile key programmer provided by an embodiment of the present invention is shown, wherein the voltage selection circuit 140 includes: a third changeover switch K3, a high-voltage transformation circuit 141, a low-voltage transformation circuit 142, and a third switch Q3.

The third changeover switch K3 includes a seventh connection terminal 70, an eighth connection terminal 80, and a ninth connection terminal 90, wherein the seventh connection terminal 70 is connected to the sixth connection terminal 60, and the seventh connection terminal 70 can communicate with the eighth connection terminal 80 or the ninth connection terminal 90.

The third changeover switch K3 is a mechanical or electronic switch capable of switching to a plurality of circuits, and in the embodiment of the present invention, the third changeover switch K3 is a relay capable of controlling switching to the high-voltage transformation circuit 141 or the low-voltage transformation circuit 142 in the voltage selection circuit 140.

The high-voltage transformation circuit 141 is connected between the eighth connection 80 and the output terminal of the frequency shift keying modulation circuit 130. The high-voltage transformation circuit 141 has a smaller impedance than the low-voltage transformation circuit 142, and through voltage division, the resonant voltage applied to both terminals of the activation coil LM by the resonant signal modulated by frequency shift keying is higher.

The low-voltage transformation circuit 142 is connected between the ninth connection 90 and the output terminal of the frequency shift keying modulation circuit 130. The low-voltage transformation circuit 142 has a larger impedance than the high-voltage transformation circuit 141, and through voltage division, the resonant voltage applied to both terminals of the activation coil LM by the resonant signal modulated by frequency shift keying is lower.

A control terminal of the third switch Q3 is connected to the main control chip MCU, a coil input terminal of the third changeover switch K3 is configured to connect a power suppl, a coil output terminal of the third changeover switch K3 is connected to an input terminal of the third switch Q3, and an output terminal of the third switch Q3 is grounded.

Herein, the third switch Q3 is an NPN triode. The main control chip MCU is configured to output a high level to the third switch Q3 and control it to turn on. The main control chip MCU is also configured to output a low level to the third switch Q3 and control it to turn off. In the embodiment of the present invention, when the third switch Q3 turns off, the third changeover switch K3 is not powered on, and the seventh connection terminal 70 is in communication with the eighth connection terminal 80; when the third switch Q3 turns on, the third changeover switch K3 is powered on, and the seventh connection terminal 70 is in communication with the ninth connection terminal 90.

In some embodiments, with continued reference to FIG. 3, the infrared modulation circuit 110 includes: a first encryption chip U1 and a first resonant circuit 111. The amplitude shift keying modulation circuit 120 includes: a second encryption chip U2 and a second resonant circuit 121. The frequency shift keying modulation circuit 130 includes: a third encryption chip U3 and a third resonant circuit 131.

In the embodiment of the present invention, a modulated resonant signal is encrypted by the first encryption chip U1, the second encryption chip U2, and the third encryption chip U3; alternatively, a data signal read from the automobile key by the activation coil LM is decrypted, so as to ensure the security of the automobile key and prevent the automobile key from being easily cracked. The first resonant circuit 111, the second resonant circuit 121, and the third resonant circuit 131 are configured to further resonate the digital signal modulated by infrared modulation, amplitude shift keying modulation, or frequency shift keying modulation in the circuit, so as to generate a resonant signal and a resonant voltage that act on the activation coil LM to enable the activation and read-write functions of the activation coil LM and the automobile key.

The first encryption chip U1 has an input terminal connected to the main control chip MCU and an output terminal connected to the second connection terminal 20; the first resonant circuit 111 is connected in parallel between two control ports of the first encryption chip U1.

The second encryption chip U2 has an input terminal connected to the main control chip MCU and an output terminal connected to the fifth connection terminal 50; the second resonant circuit 121 is connected in parallel between two control ports of the second encryption chip U2.

The third encryption chip U3 has an input terminal connected to the main control chip MCU and an output terminal connected to the high-voltage transformation circuit 141 and the low-voltage transformation circuit 142; the third resonant circuit 131 is connected in parallel between two control ports of the third encryption chip U3.

Figure 4:
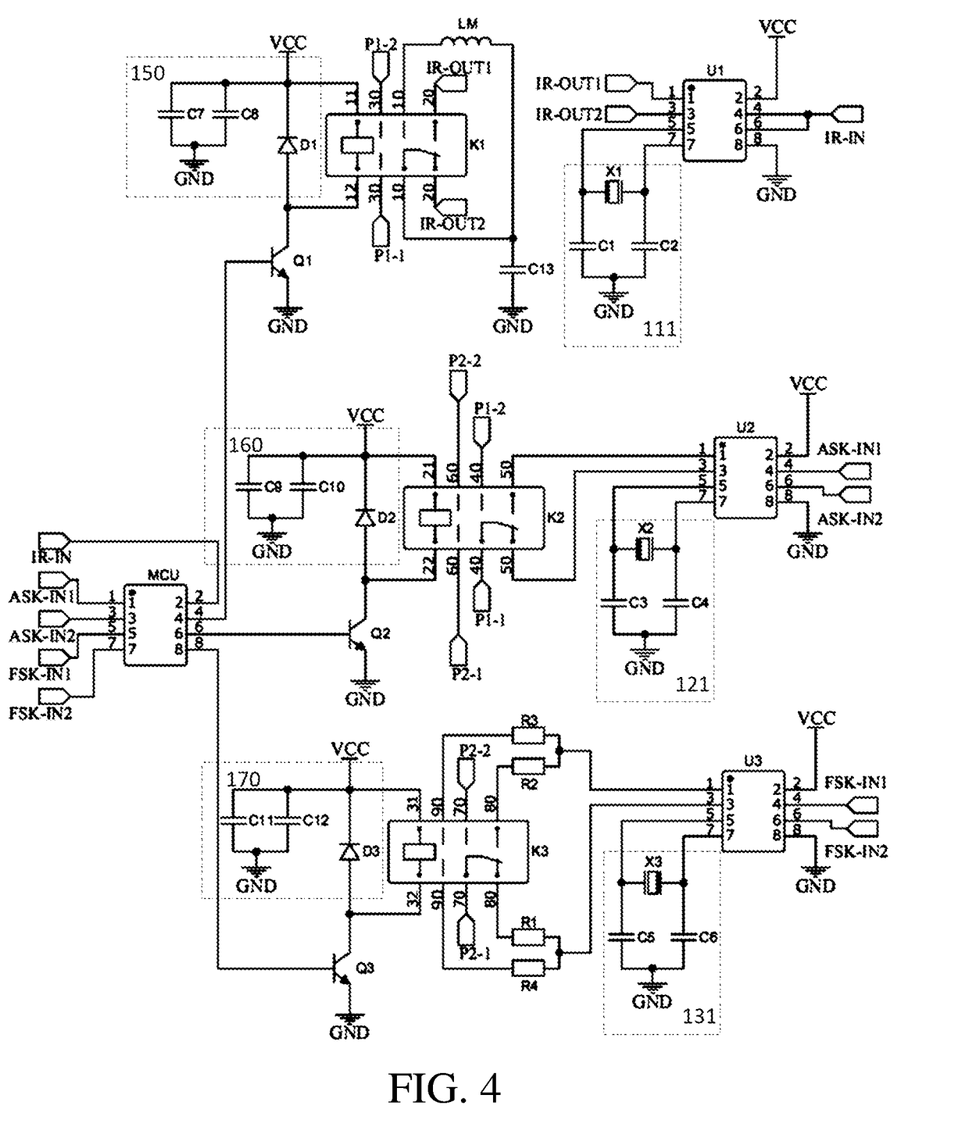
FIG. 4 is a schematic diagram showing an electrical connection of an automobile key programmer according to an embodiment of the present invention.

In some embodiments, reference is made to FIG. 4, an electrical connection of an automobile key programmer provided by an embodiment of the present invention is shown, wherein the first, second and third changeover switches K1, K2 and K3 are double-pole double-throw relays.

The first resonant circuit 111 includes: a first crystal oscillator X1, a first capacitor C1, and a second capacitor C2. The first crystal oscillator X1 is connected in parallel between the two control ports of the first encryption chip U1; the first capacitor C1 has a terminal connected to a terminal of the first crystal oscillator X1 and another terminal grounded; the second capacitor C2 has a terminal connected to another terminal of the first crystal oscillator X1 and another terminal grounded.

The second resonant circuit 121 includes: a second crystal oscillator X2, a third capacitor C3, and a fourth capacitor C4. The second crystal oscillator X2 is connected in parallel between the two control ports of the second encryption chip U2; the third capacitor C3 has a terminal connected to a terminal of the second crystal oscillator X2 and another terminal grounded; the fourth capacitor C4 has a terminal connected to another terminal of the second crystal oscillator X2 and another terminal grounded.

The third resonant circuit 131 includes: a third crystal oscillator X3, a fifth capacitor C5, and a sixth capacitor C6. The third crystal oscillator X3 is connected in parallel between the two control ports of the third encryption chip U3; the fifth capacitor C5 has a terminal connected to a terminal of the third crystal oscillator X3 and another terminal grounded; the sixth capacitor C6 has a terminal connected to another terminal of the third crystal oscillator X3 and another terminal grounded.

In the embodiment of the present invention, a resonant frequency of the signal can be adjusted by selecting types and parameters of components in the first resonant circuit 111, the second resonant circuit 121, and the third resonant circuit 131, particularly by selecting the signals and parameters of the first crystal oscillator X1, the second crystal oscillator X2, and the third crystal oscillator X3, thereby adjusting the resonant voltage.

In some embodiments, with continued reference to FIG. 4, the automobile key programmer 100 further includes: a first rectification filter circuit 150, a second rectification filter circuit 160, and a rectification filter circuit 170, which are configured to smooth a signal input to the circuit and reduce noise in the circuit.

The first rectification filter circuit 150 has an input terminal connected to the coil input terminal 11 of the first changeover switch K1 and an output terminal connected to the input terminal of the first switch Q1 and the coil output terminal 12 of the first changeover switch K1.

In particular, the first rectification filter circuit 150 includes: a seventh capacitor C7, an eighth capacitor C8, and a first diode D1. The seventh capacitor C7 has a terminal connected to the coil input terminal 11 of the first changeover switch K1 and another terminal grounded; the eighth capacitor C8 is connected in parallel to two terminals of the seventh capacitor C7; the first diode D1 has an input terminal connected to the coil output terminal 12 of the first changeover switch K1 and an output terminal connected to the coil input terminal 11 of the first changeover switch K1.

The second rectification filter circuit 160 has an input terminal connected to the coil input terminal 21 of the second changeover switch K2 and an output terminal connected to the input terminal of the second switch Q2 and the coil output terminal 22 of the second changeover switch K2.

In particular, the second rectification filter circuit includes: a ninth capacitor C9, a tenth capacitor C10, and a second diode D2. The ninth capacitor C9 has a terminal connected to the coil input terminal 21 of the second changeover switch K2 and another terminal grounded; the tenth capacitor C10 is connected in parallel to two terminals of the ninth capacitor C9; the second diode D2 has an input terminal connected to the coil output terminal 22 of the second changeover switch K2 and an output terminal connected to the coil input terminal 21 of the second changeover switch K2.

The third rectification filter circuit 170 has an input terminal connected to the coil input terminal 31 of the third changeover switch K3 and an output terminal connected to the input terminal of the third switch Q3 and the coil output terminal 32 of the third changeover switch K3.

In particular, the third rectification filter circuit 170 includes: an eleventh capacitor C11, a twelfth capacitor C12, and a third diode D3. The eleventh capacitor C11 has a terminal connected to the coil input terminal 31 of the third changeover switch K3 and another terminal grounded; the twelfth capacitor C12 is connected in parallel to two terminals of the eleventh capacitor C11; the third diode D3 has an input terminal connected to the coil output terminal 32 of the third changeover switch K3 and an output terminal connected to the coil input terminal 31 of the third changeover switch K3.

In some embodiments, with continued reference to FIG. 4, the automobile key programmer 100 further includes a thirteenth capacitor C13 having a terminal connected to a terminal of the activation coil LM and the first connection terminal 10, respectively, and another terminal grounded; the thirteenth capacitor C13 is configured to filter.

The high-voltage transformation circuit 141 includes a first resistor R1 and a second resistor R2, wherein the first resistor R1 and the second resistor R2 are connected between the eighth connection terminal 80 and the output terminal of the frequency shift keying modulation circuit 130; the low-voltage transformation circuit 142 includes a third resistor R3 and a fourth resistor R4, wherein the third resistor R3 and the fourth resistor R4 are connected between the ninth connection terminal 90 and the output terminal of the frequency shift keying modulation circuit 130; switching from one to the other of the high-voltage transformation circuit 141 and the low-voltage transformation circuit 142 is realized by controlling the on or off state of the third changeover switch K3.

In the embodiment of the present invention, a total resistance of the first resistor R1 and the second resistor R2 combined is less than a total resistance of the third resistor R3 and the fourth resistor R4 combined, so that the resonant voltage output by the high-voltage transformation circuit 141 when communicating with the frequency shift keying modulation circuit 130 is higher, and the resonant voltage output by the low-voltage transformation circuit 142 when communicating with the frequency shift keying modulation circuit 130 is lower.

Figure 5:
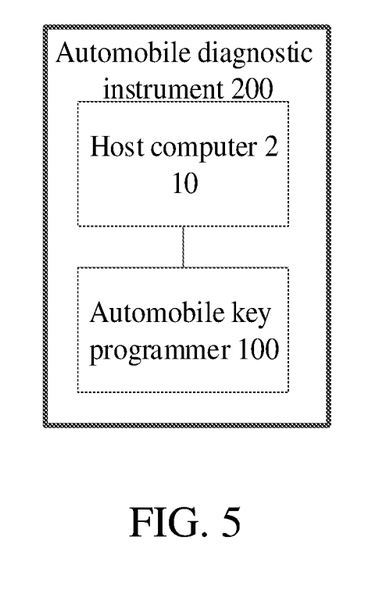
FIG. 5 is a schematic view showing a structure of an automobile diagnostic instrument according to an embodiment of the present invention.

An embodiment of the present invention also provides an automobile diagnostic instrument. Referring to FIG. 5, a structure of an automobile diagnostic instrument 200 according to an embodiment of the present invention is shown. The automobile diagnostic instrument 200 includes: a host computer 210, and an automobile key programmer 100 according to the above embodiments of FIGS. 1 to 4, wherein the host computer 210 is communicatively connected, for example, through a CAN bus, to the automobile key programmer 100.

The host computer 210 is a device for use in the automobile diagnostic instrument 200 to perform fault identification and data analysis, and to issue a control instruction and data to an interface circuit such as the automobile key programmer 100; the host computer 210 can control the automobile key programmer 100 to, for example, read and write the automobile key.

The embodiments of the present invention provide an automobile key programmer applied to an automobile diagnostic instrument, wherein the automobile key programmer includes an activation coil, a first changeover switch, a second changeover switch, an infrared modulation circuit, an amplitude shift keying modulation circuit, and a frequency shift keying modulation circuit; when the first changeover switch is not powered on, the infrared modulation circuit provides a resonant voltage for the activation coil; when the first changeover switch is powered on and the second changeover switch is not powered on, the amplitude shift keying modulation circuit provides a resonant voltage for the activation coil; when both the first changeover switch and the second changeover switch are powered on, the frequency shift keying modulation circuit provides a resonant voltage for the activation coil; only one coil is required in the automobile key programmer provided in the embodiments of the present invention to change from one to another in the three resonant voltages, so as to satisfy the needs of different types of keys for the coils.

The product embodiments described above are merely schematic, wherein the modules illustrated as separate components may be physically separated or not, and the components shown as modules may be physical units or not, i.e., they can be located in one place or distributed over a plurality of network elements. Some or all of the modules may be selected to achieve the object of the embodiments as appropriate.

Finally, it should be noted that the above embodiments are only intended to illustrate the technical solutions of the present invention, instead of limiting the same; in the concept of the present invention, the technical features in the above embodiments or different embodiments can also be combined, the steps may be carried out in any order, and many other variations of the different aspects of the invention as described above are possible, which are not provided in detail for the sake of brevity; although the invention has been described in detail with reference to the above embodiments, those of ordinary skill in the art should understand that it is still possible to modify the technical solutions recorded in the foregoing embodiments, or to made equivalent substitutions to some of the technical features; these modifications or substitutions will not result in a departure of the essence of the corresponding technical solution from the technical solutions of the embodiments of the present invention.

The invention claimed is:

1. An automobile key programmer, comprising:
   an activation coil (LM) configured to apply different resonant voltages to activate different types of automobile keys and to program the keys;
   a first changeover switch (K1) comprising a first connection terminal, a second connection terminal, and a third connection terminal, wherein the first connection terminal is connected to the activation coil (LM), and the first connection terminal is configured to be connected to the second connection terminal or the third connection terminal;
   an infrared modulation circuit connected to the second connection terminal and configured to provide an infrared modulated resonant signal and a resonant voltage for activating and reading-writing an infrared modulated automobile key;
   a second changeover switch (K2) comprising a fourth connection terminal, a fifth connection terminal, and a sixth connection terminal, wherein the fourth connection terminal is connected to the third connection terminal, and the fourth connection terminal is configured to be connected to the fifth connection terminal or the sixth connection terminal;
   an amplitude shift keying modulation circuit connected to the fifth connection terminal and configured to provide a resonant signal and a resonant voltage modulated with amplitude shift keying for activating and reading-writing an automobile key modulated by amplitude shift keying; and
   a frequency shift keying modulation circuit connected to the sixth connection terminal and configured to provide a resonant signal and resonant voltage modulated by frequency shift keying for activating and reading-writing an automobile key modulated by frequency shift keying.

2. The automobile key programmer according to claim 1, wherein
   the first changeover switch and the second changeover switch are both relays.

3. The automobile key programmer according to claim 2, further comprising:
   a main control chip connected to input terminals of the infrared modulation circuit, the amplitude shift keying modulation circuit and the frequency shift keying modulation circuit, respectively;
   a first switch having a control terminal connected to the main control chip, wherein a coil input terminal of the first changeover switch is configured to connect a power supply, a coil output terminal of the first changeover switch is connected to an input terminal of the first switch, and an output terminal of the first switch is grounded;
   a second switch having a control terminal connected to the main control chip, wherein a coil input terminal of the changeover second switch is configured to connect a power supply, a coil output terminal of the second changeover switch is connected to an input terminal of the second switch, and an output terminal of the second switch is grounded; wherein
   the main control chip is configured to output a high level, respectively, to control the first switch and the second switch to turn on.

4. The automobile key programmer according to claim 3, wherein
   the first switch and the second switch are both NPN triodes.

5. The automobile key programmer according to claim 3, further comprising:
   a voltage selection circuit is connected between the sixth connection terminal and an output terminal of the frequency shift keying modulation circuit.

6. The automobile key programmer according to claim 5, wherein the voltage selection circuit comprises:
   a third changeover switch comprising a seventh connection terminal, an eighth connection terminal, and a ninth connection terminal, wherein the seventh connection terminal is connected to the sixth connection terminal, and the seventh connection terminal can be connected to the eighth connection terminal or the ninth connection terminal;
   a high-voltage transformation circuit connected between the eighth connection terminal and the output terminal of the frequency shift keying modulation circuit; and
   a low-voltage transformation circuit connected between the ninth connection terminal and the output terminal of the frequency shift keying modulation circuit.

7. The automobile key programmer according to claim 6, wherein
   the third changeover switch is a relay.

8. The automobile key programmer according to claim 7, wherein the voltage selection circuit further comprises:
   a third switch having a control terminal connected to the main control chip, wherein a coil input terminal of the third changeover switch is configured to connect a power supply, a coil output terminal of the third changeover switch is connected to an input terminal of the third switch, and an output terminal of the third switch is grounded.

9. The automobile key programmer according to claim 8, wherein
   the third switch is an NPN triode.

10. The automobile key programmer according to claim 3, wherein the infrared modulation circuit comprises:
    a first encryption chip having an input terminal connected to the main control chip and an output terminal connected to the second connection terminal; and
    a first resonant circuit connected in parallel between two control ports of the first encryption chip.

11. The automobile key programmer according to claim 10, wherein the first resonant circuit comprises:
    a first crystal oscillator connected in parallel between two the control ports of the first encryption chip;
    a first capacitor having a terminal connected to a terminal of the first crystal oscillator and another terminal grounded; and
    a second capacitor having a terminal connected to another terminal of the first crystal oscillator and another terminal grounded.

12. The automobile key programmer according to claim 3, wherein the amplitude shift keying modulation circuit comprises:
    a second encryption chip having an input terminal connected to the main control chip and an output terminal connected to the fifth connection terminal; and
    a second resonant circuit connected in parallel between two control ports of the second encryption chip.

13. The automobile key programmer according to claim 12, wherein the second resonant circuit comprises:
- a second crystal oscillator connected in parallel between the two control ports of the second encryption chip;
- a third capacitor having a terminal connected to a terminal of the second crystal oscillator and another terminal grounded; and
- a fourth capacitor having a terminal connected to another terminal of the second crystal oscillator and another terminal grounded.

14. The automobile key programmer according to claim 6, wherein the frequency shift keying modulation circuit comprises:
- a third encryption chip having an input terminal connected to the main control chip and an output terminal connected to the high-voltage transformation circuit and the low-voltage transformation circuit; and
- a third resonant circuit connected in parallel between two control ports of the third encryption chip.

15. The automobile key programmer according to claim 14, wherein the third resonant circuit comprises:
- a third crystal oscillator connected in parallel between two the control ports of the third encryption chip;
- a fifth capacitor having a terminal connected to a terminal of the third crystal oscillator and another terminal grounded; and
- a sixth capacitor having a terminal connected to another terminal of the third crystal oscillator and another terminal grounded.

16. The automobile key programmer according to claim 3, further comprising:
- a first rectification filter circuit having an input terminal connected to the coil input terminal of the first changeover switch and an output terminal connected to the input terminal of the first switch and the coil output terminal of the first changeover switch; and
- a second rectification filter circuit having an input terminal connected to the coil input terminal of the second changeover switch and an output terminal connected to the input terminal of the second changeover switch and the coil output terminal of the second switch.

17. The automobile key programmer according to claim 16, wherein the first rectification filter circuit comprises:
- a seventh capacitor having a terminal connected to the coil input terminal of the first changeover switch and another terminal grounded;
- an eighth capacitor connected in parallel to two terminals of the seventh capacitor; and
- a first diode having an input terminal connected to the coil output terminal of the first changeover switch and an output terminal connected to the coil input terminal of the first changeover switch.

18. The automobile key programmer according to claim 16, wherein the second rectification filter circuit comprises:
- a ninth capacitor having a terminal connected to the coil input terminal of the second changeover switch and another terminal grounded;
- a tenth capacitor connected in parallel to two terminals of the ninth capacitor; and
- a second diode having an input terminal connected to the coil output terminal of the second changeover switch and an output terminal connected to the coil input terminal of the second changeover switch.

19. The automobile key programmer according to claim 8, further comprising:
- a third rectification filter circuit having an input terminal connected to the coil input terminal of the third switch and an output terminal connected to the input terminal of the third switch and the coil output terminal of the third changeover switch.

20. The automobile key programmer according to claim 19, wherein the third rectification filter circuit comprises:
- an eleventh capacitor having a terminal connected to the coil input terminal of the third changeover switch and another terminal grounded;
- a twelfth capacitor connected in parallel to two terminals of the eleventh capacitor; and
- a third diode having an input terminal connected to the coil output terminal of the third changeover switch and an output terminal connected to the coil input terminal of the third changeover switch.

* * * * *